United States Patent [19]

Ishikawa

[11] Patent Number: 4,693,907

[45] Date of Patent: Sep. 15, 1987

[54] PROCESS OR NON-ELECTROLYTIC COPPER PLATING FOR PRINTED CIRCUIT BOARD

[75] Inventor: Takakazu Ishikawa, Oogaki, Japan

[73] Assignee: Ibiden Kabushiki Kaisha, Oogaki, Japan

[21] Appl. No.: 9,645

[22] Filed: Jan. 27, 1987

Related U.S. Application Data

[63] Continuation of Ser. No. 776,083, Sep. 13, 1985, which is a continuation of Ser. No. 562,099, Dec. 16, 1983.

[30] Foreign Application Priority Data

Dec. 27, 1982 [JP] Japan .............................. 57-226758

[51] Int. Cl.$^4$ ............................................ C23C 18/40
[52] U.S. Cl. ......................................... 427/97; 427/98
[58] Field of Search ................................... 427/97, 98

[56] References Cited

U.S. PATENT DOCUMENTS

| | | | |
|---|---|---|---|
| 3,959,523 | 5/1976 | Grunwald | 427/98 |
| 4,435,189 | 3/1984 | Bovenkerk | 427/304 |
| 4,448,804 | 5/1984 | Amelia | 427/304 |

FOREIGN PATENT DOCUMENTS 57-114657 7/1982 Japan .

*Primary Examiner*—John D. Smith
*Attorney, Agent, or Firm*—Balogh, Osann, Kramer, Dvorak, Genova & Traub

[57] ABSTRACT

A printed circuit board having a multi-layered copper plating film with excellent mechanical characteristics is obtained by a process of non-electrolytic copper plating comprising at least one sequence of the following steps (a)–(d):

(a) immersing the printed circuit board to be plated in a non-electrolytic copper plating bath;
(b) drawing out the immersed board from the bath;
(c) immersing the drawn out board in the bath; and
(d) drawing out the immersed board from the bath.

In place of using one non-electrolytic copper plating bath, two non-electrolytic copper plating baths containing same solutes and having different concentration of the solutes in baths and/or different temperature of the baths respectively are used alternately.

7 Claims, No Drawings

PROCESS OR NON-ELECTROLYTIC COPPER PLATING FOR PRINTED CIRCUIT BOARD

This application is a continuation of application Ser. No. 776,083, filed Sept. 13, 1985, which is a continuation of U.S. Ser. No. 562,099, filed Dec. 16, 1983.

BACKGROUND OF THE INVENTION

Field of the Invention

The present invention relates to a process of non-electrolytic copper plating for a printed circuit board. The invention relates particularly to a process of non-electrolytic copper plating for a printed circuit board having a copper plating film with excellent mechanical characteristics.

As is well known, printed circuit boards, which are widely used in various fields of the electronic industry including public-welfare electronic machinery such as radio and television, and high-quality industrial machinery such as electronic computer, information-industry and electronic machinery, have been produced almost all by the etched foil method. In recent years, on the other hand, corresponding to high advances in the electronic machinery industry current trends are toward high density and high performance. When dealing with high density and multilamination of printed circuit boards, the conventional etched foil method is proved to be disadvantageous, because undercuts of films plated on the boards occur in an etching procedure and unequal thickness of films plated on the boards is inevitable. And further, dimensions of patterns formed on the boards are not accurate and overhanging bridge of the patterns can occur. And when small holes in a thick board such as a laminated board, for example, holes of diameter less than 1.00 mm in the board of thickness about 3.2 mm, are plated, thickness of films plated on the corner parts of the holes largely differs from thickness of films plated on the middle parts of the holes and moreover occasionally only the corner parts are plated and the middle parts not plated. Therefore, industrial production of printed circuit boards with high-density wiring and high aspect ratio (board thickness/hole diameter) is difficult. And moreover, according to the etched foil method wherein the copper-clad laminated board is used, following on the printing of a pattern on the laminated board, the plated film, excepting the film plated on the parts on which plated films should be remained must be removed in the etching procedure. The copper wasted in the etching procedure amounts to 50%-80% of the total copper used, which is extremely uneconomical. And further, since such an etching solution used to remove the copper contains, in the main, ferric chloride, cupric chloride and aqueous ammonia, if the solution is discharged carelessly, living environment may be polluted. At any rate, in the etched foil method an economic disadvantage is caused by complexity in the process of production and wastefulness of copper.

Accordingly, in place of the electrolytic plating method an additive method, whereby a pattern and through-holes are formed using non-electrolytic copper plating is attracting special interest. The additive method can meet the requirements of high performance, small size, high reliability and low cost in electronic machinery. According to the method, industrial productions of printed circuit boards having high density wiring and high aspect ratio are thus now practicable.

According to the conventional methods of non-electrolytic copper plating for printed circuit boards, surfaces of a board for plating are first degreased, using an alkaline solution. Then, the surfaces of the board are roughed making use of acids and/or others and an activation threatment is applied. The board is then immersed in a non-electrolytic copper plating bath. By keeping the board in the bath at a predetermined temperature for a specific time, a non-electrolytic copper plating film having a desired thickness is thus obtained. However, the plating film obtained by the conventional method is generally brittle and is deficient in practical use. Disconnection of a pattern formed on the bord and corner crack of through-holes which are formed in the board are caused due to the strain induced by mechanical stress in course of printed circuit board processing and implements fixing. Contrarily when a pattern and through-holes are formed by copper electroplating, there occur no disconnection, stripping and crack of the pattern and corner crack in the through-holes. As a result of measuring mechanical characteristics of a plating film obtained by the copper electroplating, it is known that tensile strength of a plated film was 30 $Kg/mm^2$–50 $Kg/mm^2$, elongation percentage 3%–8% and number of 180° bending times 4.

On the other hand, a plating film obtained by utilizing a non-electrolytic copper plating bath comprising a copper salt, a complexing agent, a reducing agent and a pH modifier possesses tensile stength about 10 $Kg/mm^2$–20 $Kg/mm^2$, elongation percentage about 0.5%, and number of bending times 1. The non-electrolytic copper plating film for the pattern and through-holes of printed circuit boards, therefore, is poor in reliability. Accordingly some attempts have been made to improve mechanical characteristics of the non-electrolytic copper plating film by adding sepecified agents to improve the plating film ductility to the bath, such as an organic sulfur compound like mercaptan, thiol or thio compounds, or heterocyclic compounds like dipyridyl or phenanthroline, and inorganic cyanide compounds. Copper plating films obtained by using such a non-electrolytic copper plating bath possess tensile strength 20 $Kg/mm^2$–35 $Kg/mm^2$, elongation percentage 1%–2% and number of bending times about 2. The plating films are practically utilized for a pattern and through-holes of printed circuit boards. However, the copper plating film for the conductor pattern and through-holes of printed circuit boards with high reliability requirement is required to have mechanical characteristics being equal to those of the copper electroplating film.

Therefore, several chemical agents have been introduced into the non-electrolytic copper plating baths in efforts to improve mechanical characteristics of the non-electrolytic copper plating film. In the additive method using a non-electrolytic copper plating bath adhesive agents are used between the film and a board for absorbing a shock which may happen during the board handling in course of the board processing and implements fixing. However, no adhesive agent effectual in adherence of the non-electrolytic copper plating film to the board in electric insulation or in heat resistance can be found hitherto. And moreover, for the sake of raising the adherence of the non-electrolytic copper plating film, a very harmful acid such as a mixture of chromic and sulfuric acids must be used as a component of the adhesive agent.

Then, according to the Japanese Patent Disclosure No. 57-114657, in forming a non-electrolytic copper plating film on a board, two kinds of non-electrolytic copper plating baths are used: first bath contains a mixture of a copper salt, a complexing agent, a reducing agent and a pH modifier as main basic components, and as a supplementary component an additive agent consisting of at least one selected from the group of non-ionic surface active agents of ethylene oxide series, dipyridyl, phenanthroline derivative and cyanide compound; and second bath contains the same basic components as contained in the first bath and as a supplementary component an additive agent consisting of at least one selected from the group of sulfur compounds, silicon compounds and phosphorous compounds. The two kinds of non-electrolytic copper plating baths are used alternately for immersion of a board in the baths, so that the non-electrolytic copper plating film having excellent mechanical characteristics is formed in layers.

However, according to the above-mentioned method, the two kinds of non-electrolytic copper plating baths with different additive agents must be provided separately. And moreover, in the non-electrolytic copper plating baths, micro quantity of the additive agents and considerable quantities of mutually interfering substances are contained. Accordingly, there is the disadvantage that the additive agents difficult to be determined by usual quantitative analysis must be regulated in both the baths for supplement.

SUMMARY OF THE INVENTION

An object of the present invention is to provide a novel process of non-electrolytic copper plating for a printed circuit board for a plating film with excellent mechanical characteristics, eliminating disadvantages of conventional processes of non-electrolytic copper plating for a printed circuit board.

Hereinafter, the present invention will be described in detail.

The invention is characterized as follows. In obtaining a predetermined thickness of a circuit copper film plated on a printed circuit board using one or two kinds of non-electrolytic copper plating baths, deposition of non-electrolytic copper plating film on the board is suspended at least one time by drawing out the board from the baths and so the non-electrolytic copper plating film is formed in plural layers on the board. Consequently, the strain due to mechanical stress induced in course of implementation or implements fixing and use of printed circuit board is dispersed and hence lessened. And thus, tensile strength, elongation percentage and number of bending times, which are the items of test in evaluation of printed circuit boards, can be improved greatly, as compared with those obtained by using conventional non-electrolytic copper plating methods.

According to the present invention, similarly to the case of conventional methods for manufacture of printed circuit boards, surfaces of a printed circuit board is first degreased and conditioned by immersing the board in an organic solvent such as trichloroethylene, or in an alkaline solution, or by spraying the solvent or solution on the board. The board is then etched using an acid, and an activation treatment is applied. The board thus treated, for example, a paper base epoxy resin board, a synthetic fiber fabric base epoxy resin board, a glass fabric base epoxy resin board or a paper base phenolic resin board, or a commercialized laminated board containing a catalyst, or a laminated board containing a substanace which can get catalytic function by irradiation of ultraviolet rays, a predetermined part of the board after irradiating is immersed in a non-electrolytic copper plating bath for a specific time and so a non-electrolytic copper plating film having a predetermined thickness is obtained on the board. The board is then drawn out from the non-electrolytic copper plating bath. An activation treatment as required is applied to the drawn board. The board is again immersed in the bath. This procedure is repeated at least one time till a thickness of the finished non-electrolytic copper plating film is attained. The film thus obtained is in the form of non-electrolytic copper plating layers. Consequently, the strain due to mechanical stress induced in course of implements fixing and use of the printed circuit board is dispersed and hence lessened. Accordingly, tensile strength, elongation percentage and number of bending times can be improved greatly, as compared with those of plating film obtained by conventional non-electrolytic copper plating methods.

In the repeated procedure of immersing the board for plating in bath for a specific time and then drawing out the board and immersing again in the bath, the immersing duration of the board may be changed each time or kept constant. Tensile strength, elongation percentage and number of bending times attained by keeping the immersing duration of the board constant can be more increased than those attained by changing each immersing duration of the board.

Then, in immersing the board for plating in the bath, the thickness of the non-electrolytic copper plating film deposited on the board each time is adjusted by increasing or decreasing the immersing duration of the board; a deposition rate is determined by respective concentrations of the four components contained in the bath, i.e. copper salt, reducing agent, pH modifier and complexing agent and temperature of the bath. By making the thickness of the non-electrolytic copper plating film deposited on the board at each immersion between 1/100 and ½ most preferably, 1/50 and ½ of the thickness of a finished non-electrolytic copper plating film, tensile strength, elongation percentage and number of bending times are increased.

In the repeated procedure of immersing the board for plating in the bath for a specific time, and then drawing out the board from the bath and immersing the board again in the bath, the non-electrolytic copper plating treatment is suspended each time by applying washing treatment with water and/or activation treatment to the board drawn out from the bath. In this manner, a non-electrolytic copper plating film is formed in layers. Consequently, tensile strength, elongation percentage and number of bending times of the film can be improved compared with those attained by conventional methods.

For the activation treatment, the following methods (1)–(3) are preferable; (1) a method of washing the board drawn out from the bath by water, immersing the washed board in a solution of an inorganic acid, washing again the withdrawn board by water and then immersing the washed board in the bath; (2) a method of wasing the withdrawn board by water, immersing the washed board in the solution of the inorganic acid, washing by water, applying a catalyst and immersing the board in the bath; (3) a method of washing the board drawn out from the bath by water, applying a catalyst and immersing the board in the bath.

For the inorganic acid used in the activation treatment various acids able to dissolve oxide of copper are usable. For example, sulfuric acid, hydrochloric acid or a mixture therof is most suitable. When concentration of the acid in the solution ranges between 0.5N and 10N, temperature thereof ranges between 5° C. and 40° C., and immersing duration of the board in the solution ranges between 1 and 10 minutes, the oxide of copper can be dissolved.

Then, the catalyst is applied to the board, as follows. The board for plating is immersed in an aqueous solution containing metallic ions of catalytic function, for example, one of the following four solutions: a solution of $PdCl_2$—$SnCl_2$—HCl (colloidal type), a solution of $PdCl_2$—$SnCl_2$—NaCl (colloidal type), a solution of paladium organic complex compound, and a solution containing copper ions. Metallic ions are thus adsorbed on the board. The board with the metallic ions adsorbed is then immersed in a solution able to reduce the metallic ions to metals, for example, a mixed solution of sulfuric acid and oxalic acid, or a mixed solution of alkaline hydroxide such as sodium hydroxide or sodium carbonate and borohydride compound. This procedure is repeated at least two times. The catalyst is thus adsorbed on the board for plating.

In the aqueous solution containing the metallic ions, when concentration of the metallic ions is thinner than 20 ppm, the amount of the catalyst adsorbed on the board is little and any deposition of copper film on the board in said bath is not initiated. When the concentration is thicker than 2500 ppm, by raising the concentration of metallic ions further, the amount of catalyst adsorbed remains constant. The concentration of metallic ions in the aqueous solution is therefore preferably between 20 ppm and 2500 ppm. Temperature of the aqueous solution containing metallic ions is preferably between 20° C. and 60° C. Then, regarding the immersing duration of the board in the solution each time, when the duration is shorter than 1 minute, the amount of catalyst adsorbed is little and deposition of copper film on the board is not initiated. By immersing the board in the solution longer beyond 10 minutes, the amount of catalyst absorbed on the board remains constant. The immersing duration adsorbed on the board is thus preferably between 1 minute and 10 minutes.

When temperature of the reducing solution is lower than 10° C., the reducing reaction is hardly induced. Then, when the temperature of the solution is higher than 50° C., autolysis of the reducing agent is caused. Therefore, the temperature of the solution is preferably between 10° C. and 50° C. Regarding the immersing duration of the board in the solution each time, when the duration is shorter than 2 minutes, the amount of metallic ions reduced to metals is little and deposition of copper film on the board in said bath is not initiated. By immersing the board to be plated in the solution for about 10 minutes, the metallic ions absorbed on the board is almost all reduced to metals; there is no need for further immersion. Accordingly, the immersing duration of the board is preferably between 2 minutes and 10 minutes. Concentration of the reducing agent in the reducing solution is preferably between 0.01 mol/l and 1 mol/l.

A non-electrolytic copper plating bath used in the present invention contains the same four components as used in conventional methods, that is, a copper salt as the source fo cupric ion, a reducing agent to convert copper ion into metallic copper, a pH modifier for effective function of the reducing agent a complexing agent to prevent the precipitation of copper in the bath, and also a stabilizer as required of the stabilizer is used to prevent autolysis of said bath and to lengthen a usable duration of said bath. The reason why the usable duration of said bath can be prolonged is that univalent copper and copper particles are masked by the stabilizer respectively.

For the stabilizer there are available chelating agents and high molecular compounds. For the former, the followings are known: sodium cyanide, potassium cyanide, nickel potassium cyanide, iron potassium cyanide, cobalt potassium cyanide, dipyridyl, 2(2-pyridyl)-imidazone, 2 (2-pyridyl)-benzimidasole, 1,10-phenanthroline, 2.9-dimethyl-1.10-phenanthroline, 4.7-diphenyl-1.10-phenanthroline, 4.7-diphenyl-2.9-dimethyl-1.10-phenanthroline, thiourea, allylthiourea, rhodanine, and 2-mercaptobenzothiazole. For the latter, polyethylene glycol, polyethylene oxide and the like are known.

For the copper salt, copper sulfate, cupric chloride, copper acetate, copper nitrate and the like may be used. For reasons of cost, however, copper sulfate is most desirable. For the reducing agent, hydrazine, formalin, borohydride compound and sodium dihydrogen hypophosphite may be used. For reasons of stability and cost, formalin is most desirable. For the pH modifier, sodium hydroxide, potassium hydroxide, sodium carbonate, aqueous ammonia and the like may be used. Of these, sodium hydroxide is most desirable. Then, for the complexing agent, potassium sodium tartarate and ethylenediamintetraacetic acid sodium salt may be used. For reasons of stability and rapid reaction of said bath, ethylenediamintetraacetic acid sodium salt is desirable.

Concerning concentrations of the above four components in said bath, the following are preferable: between 0.01 mol/l and 0.15 mol/l for the copper salt; between 0.1 mol/l and 1 mol/l for the reducing agent; between 0.1 mol/l and 1 mol/l for the pH modifier; between 1 time and 3 times as much as the molar concentration of the copper ion for the complexing agent.

Then, concerning temperature of the bath, when the temperature is higher than 80° C., decomposition of the bath is caused. When the temperature of the bath is lower than 30° C., the rate of copper deposition is too slow; it takes too much time to attain a desired thickness of the non-electrolytic copper plating film. Accordingly, the temperature of the bath is preferably in the range from 30° C. to 80° C.

The board treated as forementioned is immersed in the bath for a specific time. The board is then drawn out from the bath. The board is again immersed in the bath. In this case, the time elapsed from the withdrawal to the next immersion is preferably less than 45 minutes. The reason is that when the board is exposed to washing water or air for extended time, there forms an oxide film on the surface of copper deposited on the board. As adherence between this oxide film and the next copper deposite is less satisfactory, the elapsed time is preferably less than 45 minutes.

The object of the present invention can also be accomplished by a process of non-electrolytic copper plating for a printed circuit board having a copper plating film with excellent mechanical characteristics using two kinds of non-electrolytic copper plating baths. This process will be described in detail.

In the two kinds of non-electrolytic copper plating baths used in this case, the kind of solutes and the kind of additive agents contained in both non-electrolytic copper plating baths are same respectively. At least one of the following two factors selected from the factor group comprising the concentrations of respective solutes and temperatures of both baths is different. In immersing a board for plating in both baths alternately, the board is immersed in a first one of the non-electrolytic copper plating baths for a specific time and a copper film is deposited on the board to a desired thickness. The board is then drawn out from the first bath, and then an activation treatment as required is applied to the board. The board is then immersed in a second bath. This single procedure produces a double-layered film. Further the repeated procedures produces a multi-layered film of a desired thickness. Consequently, a strain due to mechanical stress induced in course of implements fixing onto printed circuit boards and of printed circuit boards in use is dispersed and hence lessened. Accordingly, tensile strength, elongation percentage and number of bending times, which are mechanical characteristics of printed circuit boards, are greatly increased in comparison with those of a single-layer film obtained by the conventional method. According to the present invention the following three combinations of both copper plating baths may be chosen: (1) a combination of both baths in which concentrations of respective solutes are the same whereas temperatures of baths are not equal; (2) a combination of both baths in which concentrations of respective solutes are not equal whereas temperatures of both baths are equal; (3) a combination of both baths in which concentrations of respective solutes are not equal and also temperatures of both baths are not equal. By any one of the above three combinations, tensile strength, elongation percentage and number of bending times are improved compared with those of the single-layer film.

The thickness of a copper film thus obtained in the first bath each time is preferably between 1/30 and 1/2 of the thickness of a finished copper film deposited on the board and the thickness of a copper film deposited on the board in the second bath each time is between 1/100 and 1/30 of the thickness of the finished film.

In the non-electrolytic copper plating process by any one of the three combinations of both baths, the board to be plated is immersed in the first bath. The board is then drawn out from the first bath and is washed by water to remove the plating solution adhering on the board. Then, the board is immersed in the second bath. By repeating this procedure, a multi-layered copper film is formed on the board. Consequently, tensile strength, elongation percentage and number of bending times are improved.

If necessary, any one of two procedures described hereunder may be added.

The One Procedure:

An activation treatment is applied to the board drawn out from the first bath prior to immersion in the second bath and then the board is immersed in the second bath.

The Other Procedure:

The activation treatment is applied to the board drawn out from the second bath prior to immersion in the first bath and then the board is immersed in the first bath and further after drawing out the board from the first bath, a washing treatment is applied prior to immersion in the second bath.

The activation treatment optionally applied to the board drawn out from the first bath prior to immersion in the second bath is made prefably by the following three methods.

As a first method, the withdrawn board is washed by water to remove the plating solution adhering onto the board. The board is then immersed in a solution of an inorganic acid to dissolve oxide formed on the surface of copper and micro quantity of metallic copper, thereby the copper surface is cleaned. The board is washed by water to remove the inorganic acid adhering onto the board. Then, the board is immersed in the second bath.

As a second method the withdrawn board from the first bath is washed by water. Then, the board is immersed in the solution of the inorganic acid to clean the copper surface. A catalyst is applied to the clean board. The board is then immersed in the second bath.

The inorganic acid used in these two kinds of the activation treatments is, as described above, an inorganic acid able to dissolve copper oxide. For example, a solution containing hydrochloric acid or sulfuric acid, or a mixture thereof is preferable. When concentration of the inorganic acid in the solution is thinner than 0.5N, the copper oxide and metallic copper are hardly dissolved. Even when the concentration is raised thicker than 10N, the dissolution rate of the copper oxide and metallic copper is little increased. Therefore, the concentration is preferably between 0.5N and 10N. Temperature of the solution of the inorganic acid is preferably between 5° C. and 40° C. The immersing duration of the board in the solution each time is preferably between 1 minute and 10 minutes.

As the third method a board for plating is immersed in the first bath for a specific time. The board is then withdrawn from the first bath. An activation treatment applied to the board in the third method only prior to immersion in the second bath is made as follows. The withdrawn board from the first bath is washed by water to remove the plating solution adhering onto the board. Then, a catalyst is applied to the board. By any one of the three methods, tensile strength, elongation percentage and number of bending times are improved.

A catalyst is applied to the board, as follows. The board is first immersed in an aqueous solution containing metallic ions of catalytic function, for example, one of the following four solutions: a solution of $PdCl_2$-$SnCl_2$-HCl (colloidal type), a solution of $PdCl_2$-$SnCl_2$-NaCl (colloidal type), a solution of palladium organic complex compound and a solution containing copper ions. The metallic ions are thus adsorbed on the board. The board with the metallic ions adsorbed is then immersed in a solution able to reduce the metallic ions of catalytic function into metals, for example, a mixed solution of sulfuric acid and oxalic acid or a mixed solution of alkaline hydroxide such as sodium hydroxide or sodium carbonate and borohydride compound. The metallic ions are thus reduced to metals. This procedure may be repeated so that the catalyst is absorbed on the board.

In the aqueous solution containing the metallic ions used in this the catalyst application, when a concentration of the metallic ions in the solution is thinner than 20 ppm, the amount of catalyst adsorbed on the board is little and any deposition of copper plating film is not initiated. When the concentration is thicker than 2500 ppm, the amount of metals deposited remains almost constant. Therefore, the concentration of the metallic ions in the solution is preferably between 20 ppm and 2500 ppm. When temperature of the solution is lower than 20° C., the amount of metallic ions adsorbed on the board is little and thus there occur partial deposition of the copper film. When the temperature of the solution is higher than 60° C., decomposition of the solution is caused. Therefore, the temperature of the solution is preferably between 20° C. and 60° C. Concerning the immersing duration of the board each time, when the immersing duration is shorter than 1 minute the amount of metallid ions adsorbed on the board is little, and any deposition of copper film on the board is not initiated. When the immersing duration is longer than 10 minutes the amount of metallic ions adsorbed remains almost constant. The immersing duration is preferably between 1 minute and 10 minutes:

In the reducing solution to reduce the metallic ions to metals, temperature of the solution, concentration and immersing duration will be described. When temperature of the solution is lower than 10° C., the reducing reaction is hardly induced. Then, when the temperature is higher than 50° C., autolysis of the reducing agent is caused. The temperature is preferably between 10° C. and 50° C. About the immersing duration of the board each time, when the immersing duration is shorter than 2 minutes, the amount of metallic ions reduced to metals is little and any deposition of non-electrolytic copper plating film on the board is not initiated. By immersing for about 10 minutes, the metallic ions adsorbed on the board is almost all reduced to metals; there is no need for any further immersion. The immersing dulation is preferably between 2 minutes and 10 minutes. When concentration of the reducing solution is thinner than 0.01 mol/l, the reaction of reducing the metallic ions to metals is not induced. Then, when the concentration is thicker than 1 mol/l, the concentration is in excess for the metallic ions and so the rate of reducing reaction becomes almost constant. The concentration is preferably between 0.01 mol/l and 1 mol/l.

According to the present invention, the non-electrolytic copper plating baths contain the same components as those used in conventional methods, i.e. copper salt as the source of cupric ion, a reducing agent to convert copper ions into the metallic copper, a pH modifier to make the solution alkaline for activating the reducing agent and a complexing agent to prevent the precipitation of copper in the alkaline solution and also a stabilizer as required. In stabilizer is used to prevent autolysis of the non-electrolytic copper plating baths, thereby lengthening life of both baths. The reason for this prolonging of life of the baths is the masking of univalent copper and copper particles by the stabilizer.

For the stabilizer, there are available chelating agents and high molecular agents. For the former, the following are known: sodium cyanide, potassium cyanide, nickel potassium cyanide, iron potassium cyanide, cobalt potassium cyanide, dipyridyl, 2(2-pyridyl)-imidazone, 2(2-pyridyl)-benzimidazole, 1.10-phenonthroline, 4.7-diphenyl-1.10-phenanthroline, 4.7-diphenyl-2.9-dimethyl-1.10-phenanthroline, thiourea, allylthiourea, rhodanine, and 2-mercaptobenzothiasole. For the latter, such as polyethylene glycol and polyethylene oxide are known.

For the copper salt, copper sulfate, cupric chloride, copper acetate and copper nitrate may be used. For the reasons of cost etc., however, copper sulfate is desirable. For the reducing agent, hydrazine, formalin, borohydride compound and sodium dihydrogen hypophosphite may be used. For reasons of cost and stability of the baths, formalin is desirable. for the pH modifier, sodium hydroxide, potassium hydroxide, sodium carbonate and aqueous ammonia may be used. For reasons of cost, sodium hydroxide is desirable. Then, for the complexing agent, potassium sodium tartarate and ethylenediamintetraacetic acid sodium salt may be used. For reasons of stability of both baths and rapidity of the deposition rate of copper film, ethylenediamintetraacetic acid sodium salt is desirable.

Concerning concentrations of the four components in both copper plating baths, when concentration of the copper salt is thinner than 0.01 mol/l, any deposition of non-electrolytic copper plating is not induced. Then, when the concentration is thicker than 0.15 mol/l, there form copper particles in the solution in course of non-electrolytic copper plating, in so to speak, the decomposition of the non-electrolytic copper plating baths. Therefore, the concentration is preferably between 0.01 mol/l and 0.15 mol/l. When concentration of the reducing agent is lower than 0.1 mol/l, the reaction of reducing the divalent copper ion to metallic copper is not induced. When the concentration is about 1 mol/l, the rate of copper deposition is nearly constant. The concentration is thus preferably between 0.1 mol/l and 1 mol/l. Then, when concentration of the pH modifier is thinner than 0.1 mol/l, any deposition of non-electrolytic copper plating is not induced. When the concentration is thicker than 1 mol/l, decomposition of the non-electrolytic copper plating baths is caused. The concentration is preferably between 0.1 mol/l and 1 mol/l. The complexing agent is used to prevent the precipitation of copper hydroxide resulting from the reaction of divalent copper ion and hydroxide. The concentration is preferably between 1 time and 3 times as much as the molar concentration of the copper ion.

About temperature of both baths, when the temperature is lower than 30° C., the rate of copper deposition is too slow; it takes too much time to attain a desired thickness of non-electrolytic copper plating. Then, when the temperature is higher than 80° C., decomposition of both baths is caused. Accordingly, the temperature is preferably between 30° C. and 80° C. The time between the withdrawal of the board from any one of both baths and the immersion of the board in the other bath is preferably less than 45 minutes. The reason is that when the board is exposed to washing water or air for extended time, there forms oxide film on the surface of copper deposited on the board; the adherence between the oxide film and copper deposited on the oxide film is unsatisfactory. By a thermal strain such as that induced in drying or swelling is caused in the copper plating film. The time less than 45 minutes is thus desirable.

A process of obtaining a non-electrolytic copper plating film on a board with tensile strength, elongation percentage and number of bending times similar to those of copper electroplating film has been described above in detail, wherein using one or two kinds of non-electrolytic copper plating baths, a non-electrolytic copper plating film is formed in layers on the board.

In another embodiment of the present invention, three or more kinds of non-electrolytic copper plating baths may be used in which the kind of solutes are the same and at least one of concentrations of respective solutes and temperatures of baths are not equal. A board to be plated is immersed in the respective non-electrolytic copper plating baths successively and so a non-electrolytic copper plating film is frmed in layers on the board. Consequently, a non-electrolytic copper plating film with tensile strength, elongation percentage and number of bending times similar to those of the copper electroplating film is obtained.

DESCRIPTION OF THE PREFERRED EMBODIMENT

EXAMPLE 1

A stainless steel board of which the surface was polished mechanically was degreased using an aqueous sodium hydroxide solution of concentration 10 g/l. A catalyst was then applied to the surface thereof using Shipley Company Inc.'s Cataposit 44 in aqueous solution and same company's Accelerator 19. This was used as a board for plating. Said board was immersed continuously in a non-electrolytic copper plating bath of composition 1 in Table 1 at bath temperature 60° C. and so a non-electrolytic copper plating film of thickness 35 μm–40 μm was formed on the board. The plating film was stripped off from the stainless steel board, and cut into pieces, each of width 10 mm and length 100 mm. Tensile strength and elongation percentage of the specimen were then measured using Toyo Baldwin Co. Ltd.'s tension tester. Another specimen was subjected to a bending test in which the specimen was bent by 180° C. and returned to the original state. The number of bending times at which there occurred a crack at the bend was measured. The results are shown in Table 2.

In a copper-clad glass fabric base epoxy resin board of size 10 mm×10 mm×thickness 1.6 mm, 250 holes, each of diameter 1.00 mm, were made using a drill. Then, said board was degreased using Shipley Company Inc.'s alkylate in aqueous solution and the surface thereof was conditioned using same company's conditioner 1160 in aqueous solution. The surface of copper was then roughed using an aqueous ammonium persulfate solution. Then, a catalyst was applied to the surface of the board using Shipley Company Inc.'s Cataposit 44 in aqueous solution and same company's Accelerator 19. By using a non-electrolytic copper plating bath of the same composition and same bath temperature as described, a non-electrolytic copper plating film of thickness 35 μm–40 μm was formed on the board by the same process as described. The resultant board obtained by said process was immersed in solder in a solder tank at 260° C. for 10 sec, cooled naturally for 5 sec and immersed in trichloroethylene at room temperature. Taking this procedure as one cycle, the number of cycles at which there occurred a crack in corner part of the holes was measured. The result of this solder-dipping test is shown in Table 3.

TABLE 1

| Compositions of non-electrolytic copper plating baths | | | | | |
|---|---|---|---|---|---|
| | composition 1 | composition 2 | composition 3 | composition 4 | composition 5 |
| copper sulfate | 0.03 mol/l | 0.02 mol/l | 0.06 mol/l | 0.06 mol/l | 0.04 mol/l |
| formalin | 0.15 mol/l | 0.10 mol/l | 0.30 mol/l | 0.15 mol/l | 0.12 mol/l |
| sodium hydroxide | 0.30 mol/l | 0.15 mol/l | 0.36 mol/l | 0.45 mol/l | 0.25 mol/l |
| EDTA 2Na salt | 0.05 mol/l | 0.03 mol/l | 0.12 mol/l | 0.15 mol/l | 0.06 mol/l |
| sodium cyanide | 5 mg/l | — | — | 5 mg/l | 5 mg/l |
| dipyridyl | — | 5 mg/l | — | 5 mg/l | — |
| thiourea | — | — | 5 mg/l | — | 5 mg/l |
| polyethylene glycol | 1 g/l | 1 g/l | — | 5 g/l | — |
| polyethylene oxide | — | — | 5 g/l | — | 3 g/l |

| | composition 6 | composition 7 | composition 8 | composition 9 |
|---|---|---|---|---|
| copper sulfate | 0.05 mol/l | 0.06 mol/l | 0.03 mol/l | 0.03 mol/l |
| formalin | 0.40 mol/l | 0.30 mol/l | 0.15 mol/l | 0.10 mol/l |
| sodium hydroxide | 0.40 mol/l | 0.36 mol/l | 0.18 mol/l | 0.20 mol/l |
| EDTA 2Na salt | 0.11 mol/l | 0.12 mol/l | 0.06 mol/l | 0.05 mol/l |
| sodium cyanide | 5 mg/l | 10 mg/l | 5 mg/l | 5 mg/l |
| dipyridyl | 5 mg/l | 10 mg/l | 5 mg/l | 5 mg/l |
| thiourea | — | — | — | — |
| polyethylene glycol | 5 g/l | 2 g/l | 1 g/l | 1 g/l |
| polyethylene oxide | — | — | — | — |

TABLE 2

| Mechanical characteristics of plating film | | | |
|---|---|---|---|
| Example | tensile strength (Kg/mm$^2$) | elongation percentage (%) | number of bending times (time) |
| 1 | 27.7 | 1.0 | 1 |
| 2 | 48.4 | 5.5 | 4 |
| 3 | 36.2 | 3.4 | 3 |
| 4 | 38.4 | 3.7 | 3 |
| 5 | 38.3 | 3.8 | 3 |
| 6 | 40.5 | 4.0 | 4 |
| 7 | 41.2 | 4.1 | 4 |
| 8 | 37.6 | 3.6 | 3 |
| 9 | 44.8 | 4.6 | 4 |
| 10 | 46.7 | 4.9 | 4 |
| 11 | 47.3 | 5.0 | 4 |
| 12 | 42.6 | 4.3 | 4 |
| 13 | 46.3 | 4.7 | 4 |
| 14 | 45.1 | 4.8 | 4 |
| 15 | 44.9 | 4.6 | 4 |
| 16 | 45.2 | 4.8 | 4 |
| 17 | 46.4 | 5.2 | 4 |
| 18 | 46.1 | 5.0 | 4 |
| 19 | 45.7 | 4.9 | 4 |

TABLE 2-continued

Mechanical characteristics of plating film

| Example | tensile strength (Kg/mm²) | elongation percentage (%) | number of bending times (time) |
| --- | --- | --- | --- |
| 20 | 44.9 | 4.7 | 4 |
| 21 | 45.5 | 4.8 | 4 |
| 22 | 46.3 | 5.0 | 4 |
| 23 | 45.7 | 5.2 | 4 |
| 24 | 48.2 | 5.6 | 4 |
| 25 | 47.6 | 5.5 | 4 |
| 26 | 45.9 | 5.1 | 4 |
| 27 | 47.3 | 5.3 | 4 |

TABLE 3

Solder-dipping test

| Example | the number of cycles at which there occurred a crack in corner part (cycle) |
| --- | --- |
| 1 | 1 |
| 2 | 9 |
| 3 | 6 |
| 4 | 6 |
| 5 | 6 |
| 6 | 7 |
| 7 | 7 |
| 8 | 6 |
| 9 | 7 |
| 10 | 8 |
| 11 | 9 |
| 12 | 7 |
| 13 | 8 |
| 14 | 8 |
| 15 | 8 |
| 16 | 8 |
| 17 | 8 |
| 18 | 8 |
| 19 | 8 |
| 20 | 8 |
| 21 | 8 |
| 22 | 8 |
| 23 | 8 |
| 24 | 9 |
| 25 | 9 |
| 26 | 8 |
| 27 | 9 |

EXAMPLE 2

A stainless steel board of which the surface was polished mechanically was degreased using an aqueous sodium hydroxide solution of concentration 10 g/l. The board was then washed by water and neutralized with a sulfuric acid solution of 3.6 N. Then, by plating the board in a copper sulfate solution, a copper electroplating film of thickness 35 $\mu$m–40 $\mu$m was formed on the board. The copper film was stripped off from the board. Tensile strength, elongation percentage and number of bending times of the film were measured by the same methods as in Example 1. The results are shown in Table 2.

In a copper-clad glass fabric base epoxy resin board holes were made in the same manner as in Example 1. The board was then degreased using Shipley Company Inc.'s Neutra-clean in aqueous solution. The surface of copper was roughed using an aqueous ammonium persulfate solution. Then, the board was immersed in a sulfuric acid solution of 3.6N and so oxide on the surface was dissolved. By plating the board in a copper sulfate solution, a copper electroplating film of thickness 35 $\mu$m–40 $\mu$m was formed on the board. The resultant board obtained by said method was then subjected to solder-dipping test. The number of cycles at which there occurred a crack in corner part of the holes was thus measured. The result is shown in Table 3.

EXAMPLE 3

By the same method as in Example 1. a catalyst was applied to a stainless steel board of which the sulface was polished mechanically. This board was used as a board for plating.

Said board was immersed in a non-electrolytic copper plating bath of composition 1 at bath temperature 60° C. and so a plating film of thickness 2 $\mu$m was formed on the board. Said board was then drawn out from said plating bath. The board was washed by water and so the non-electrolytic copper plating solution adhering to it was removed.

The board was immersed in said non-electrolytic copper plating bath. By repeating this procedure, a non-electrolytic copper plating film of thickness 35 $\mu$m–40 $\mu$m was formed on the board. The plating film was then stripped off from the board. Tensile strength, elongation percentage and number of bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 1 and bath temperature 60° C., a plating film of thickness 35 $\mu$m–40 $\mu$m was formed on the board by the same plating process as described. The resultant board obtained by the process was then subjected to solder-dipping test. The number of cycles at which there occurred a crack in corner part of the holes was measured. The result is shown in Table 3.

EXAMPLE 4

By the same method as in Example 1, a catalyst was applied to a stainless steel board of which the surface was polished mechanically. This board was used as a board for plating.

The board was immersed in a non-electrolytic copper plating bath of composition 2 shown in Table 1 at bath temperature 80° C. and so a plating film of thickness 1 $\mu$m was formed on the board. The board was drawn out from said plating bath. After washing by water, the board was immersed in said non-electrolytic copper plating bath. By repeating this procedure, a non-electrolytic copper plating film of thickness 35 $\mu$m–40 $\mu$m was formed on the board. The plating film was then stripped off from the stainless steel board. Tensile strength, elongation percentage and number of bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 2 and bath temperature 80° C., a plating film of thickness 35 $\mu$m–40 $\mu$m was formed on the board by the same plating process as described. The resultant board obtained by the process was then subjected to solder-dipping test. The number of cycles at which there occurred a crack in corner part of the holes was measured. The result is shown in Table 3.

EXAMPLE 5

By the same method as in Example 1, a catalyst was applied to a stainless steel board of which the surface was polished mechanically. This was used as a board for plating.

The board was immersed in a non-electrolytic copper plating bath of composition 3 shown in Table 1 at bath temperature 60° C. and so a plating film of thickness 4 $\mu$m was formed on the board. The board was drawn out from said plating bath, and washed by water. The board was then immersed in a hydrochloric acid solution of 1.0N at 20° C. for 5 min. After washing with water, the board was immersed in said non-electrolytic copper plating bath. By repeating this procedure, a non-electrolytic copper plating film of thickness 35 $\mu$m–40 $\mu$m was formed on the board. The plating film was stripped off from the stainless steel board. Tensile strength, elongation percentage and number of bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 3 and bath temperature 60° C., a plating film of thickness 35 $\mu$m–40 $\mu$m was formed on the board by the same plating process as described. The resultant board obtained by the process was then subjected to solder-dipping test. The number of cycles at which there occurred a crack in corner part of the holes was measured. The result is shown in Table 3.

EXAMPLE 6

By the same method as in Example 1, a catalyst was applied to a stainless steel board of which the surface was polished mechanically. This board was used as a board for plating.

The board was immersed in a non-electrolytic copper plating bath of composition 4 shown in Table 1 at bath temperature 50° C. and so a plating film of thickness 2 $\mu$m was formed on the board. The board was drawn out from said plating bath, and washed by water. The board was then immersed in a hydrochloric acid solution of 1.0N at 40° C. for 2 min. After washing by water, the board was immersed in said non-electrolytic copper plating bath. By repeating this procedure, a non-electrolytic copper plating film of thickness 35 $\mu$m–40 $\mu$m was formed on the board. The plating film was then stripped off from the stainless steel board. Tensile strength, elongation percentage and number of bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 4 and bath temperature 50° C., a plating film of thickness 35 $\mu$m–40 $\mu$m was formed on the board by the same plating process as described. The resultant board obtained by the process was then subjected to solder-dipping test. The number of cycles at which there occurred a crack in corner part of the holes was measured. The result is shown in Table 3.

EXAMPLE 7

By the same method as in Example 1, a catalyst was applied to a stainless steel board of which the surface was polished mechanically. This was used as a board for plating.

The board was immersed in a non-electrolytic copper plating bath of composition 1 at bath temperature 70° C. and so a plating film of thickness 2 $\mu$m was formed on the board. The board was then drawn out from said plating bath, and washed by water. Then, the board was dipped in an aqueous sulfuric acid solution of 3.6N at 30° C. for 1 minute. After washing by water, the board was immersed in said non-electrolytic copper plating bath. By repeating this procedure, a non-electrolytic copper plating film of thickness 35 $\mu$m–40 $\mu$m was formed on the board. The plating film was then stripped off from the stainless steel board. Tensile strength, elongation percentage and number of bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 1 and bath temperature 70° C. a plating film of thickness 35 $\mu$m–40 $\mu$m was formed on the board by the same plating process as described. The resultant board obtained by the process was then subjected to solder-dipping test. The number of cycles at which there occurred a crack in corner part of the holes was measured. The result is shown in Table 3.

EXAMPLE 8

By the same method as in Example 1, a catalyst was applied to a stainless steel board of which the surface was polished mechanically. This board was used as a board for plating.

The board was immersed in a non-electrolytic copper plating bath of composition 4 at bath temperature 60° C. and so a plating film of thickness 5 $\mu$m was formed on the board. The boards was then drawn out from said plating bath, and washed by water. Then, the board was dipped in a sulfuric acid solution of 7.2N at 50° C. for 1 minute. After washing by water, said board was immersed in said non-electrolytic copper plating bath. By repeating this procedure, a non-electrolytic copper plating film of thickness 35 $\mu$m–40 $\mu$m was formed on the board. The plating film was then stripped off from the stainless steel board. Tensile strength, elongation percentage and number of bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 4 and bath temperature 60° C., a plating film of thickness 35 $\mu$m–40 $\mu$m was formed on the board by the same plating process as described. The resultant board obtained by said process was then subjected to solder-dipping test. The number of cycles at which there occurred a crack in corner part of the holes was measured. The result is shown in Table 3.

EXAMPLE 9

By the same method as in Example 1, a catalyst was applied to a stainless steel board of which the surface was polished mechanically. This board was used as a board for plating.

The board was immersed in a non-electrolytic copper plating bath of composition 5 shown in Table 1 at bath temperature 60° C. and so a plating film of thickness 3 $\mu$m was formed on the board. The board was then drawn out from said plating bath, and washed by water. Then, the board was immersed in a sulfuric acid solution of 3.6 N at 30° C. for 2 minutes. After washing by water, the board was immersed in a PdCl$_2$-SnCl$_2$-HCl solution of concentration 500 ppm at 50° C. for 3 minutes. The board was drawn out, and washed by water. Then, the board was immersed in an aqueous solution containing sulfuric acid and oxalic acid, each of concentration 0.5 mol/l, at 40° C. for 8 minutes. After washing by water, the board was immersed in said non-electrolytic copper plating bath. By repeating this procedure, a non-electrolytic copper plating film of thickness 35 $\mu$m–40 $\mu$m was frmed on the board. The plating film was stripped off from the stainless steel board. Tensile strength, elongation percentage and number of bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 5 and bath temperature 60° C., a plating film of thickness 35 $\mu$m–40 $\mu$m was formed on the board by the same plating process as described. The resultant board obtained by said process was then subjected to solder-dipping test. The number of cycles at which there occurred a crack in corner part of the holes was measured. The result is shown in Table 3.

EXAMPLE 10

By the same method as in Example 1, a catalyst was applied to a stainless steel board of which the surface was polished mechanically. This board was used as a board for plating.

The board was immersed in a non-electrolytic copper plating bath of composition 3 at bath temperature 60° C. and so a plating film of thickness 2 $\mu$m was formed on the board. The board was then drawn out from said plating bath, and washed by water. Then, the board was immersed in a hydrochloric acid solution of 1.2N at 40° C. for 1 minute. After washing by water, the board was then immersed in a PdCl$_2$-SnCl$_2$-HCl solution of concentration 250 ppm at 40° C. for 6 minutes. The board was drawn out and washed by water. Then, the board was immersed in an aqueous solution containing sulfuric acid and oxalic acid, each of concentrations 0.4 mol/l, at 50° C. for 7 minutes. After washing by water, said board was immersed in said non-electrolytic copper plating bath. By repeating this procedure, a non-electrolytic copper plating film of thickness 35 $\mu$m–40 $\mu$m was formed on the board. The plating film was then stripped off from the stainless steel board. Tensile strength, elongation percentage and number of bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 3 and bath temperature 60° C., a plating film of thickness 35 $\mu$m–40 $\mu$m was formed on the board by the same plating process as described. The resultant board obtained by said process was then subjected to solder-dipping test. The number of cycles at which there ccurred a crack in corner part of the holes was measured. The result is shown in Table 3.

EXAMPLE 11

By the same method as in Example 1, a catalyst was applied to a stainless steel board of which the surface was polished mechanically. This board was used as a board for plating.

The board was immersed in a non-electrolytic copper plating bath of composition 2 at bath temperature 70° C. and so a plating film of thickness 1 $\mu$m was formed on the board. The board was then drawn our from said plating bath, and washed by water. Then, the board was immersed in a sulfuric acid solution of 3.6N at 40° C. for 5 minutes. After washing by water, the board was then immersed in a PdCl$_2$-Cl solution of concentration 300 ppm at 50° C. for 5 minutes. The board was drawn out and washed by water. Then, the board was immersed in an aqueous solution containing sulfuric acid and oxalic acid, each of concentrations 0.3 mol/l, at 30° C. for 10 minutes. After washing by water, the board was immersed in said non-electrolytic copper plating bath. By repeating this procedure, a non-electrolytic copper plating film of thickness 35 $\mu$m–40 $\mu$m was formed on the board. The plating film was then stripped off from the stainless steel board. Tensile strength, elongation percentage and number of bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 2 and bath temperature 70° C., a plating film of thickness 35 $\mu$m–40 $\mu$m was formed on the board by the same plating process as described. The resultant board obtained by said process was then subjected to solder-dipping test. The number of cycles at which there occurred a crack in corner part of the holes was measured. The result is shown in Table 3.

EXAMPLE 12

By the same method as in Example 1, a catalyst was applied to a stainless steel board of which the surface was polished mechanically. This board was used as a board for plating.

The board was immersed in a non-electrolytic copper plating bath of composition 6 shown in Table 1 at bath temperature 70° C. and so a plating film of thickness 5 $\mu$m was formed on the board. The board was then drawn out from said plating bath, and washed by water. Then, the board was immersed in a hydrochloric acid solution of 1.2N at 20° C. for 8 minutes. After washing by water, the board was then immersed in a PdCl$_2$-SnCl$_2$-NaCl solution of concentration 200 ppm at 60° C. for 8 minutes. The board was drawn out and washed by water. Then, the board was immersed in an aqueous solution containing sulfuric acid and oxalic acid, each of concentrations 0.4 mol/l, at 40° C. for 6 minutes. After washing by water, the board was immersed in said non-electrolytic copper plating bath. By repeating this procedure, a non-electrolytic copper plating film of thickness 35 μm–40 μm was formed on the board. The plating film was then stripped off from the stainless steel board. Tensile strength, elongation percentage and number of bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 6 and bath temperature 70° C., a plating film of thickness 35 μm–40 μm was formed on the board by the same plating process as described. The resultant board obtained by said process was then subjected to solder-dipping test. The number of cycles at which there occurred a crack in corner part of the holes was measured. The result is shown in Table 3.

EXAMPLE 13

By the same method as in Example 1, a catalyst was applied to a stainless steel board of which the surface was polished mechanically. This board was used as a board for plating.

The board was immersed in a non-electrolytic copper plating bath of composition 4 at bath temperature 50° C. and so a plating film of thickness 2 μm was formed on the board. The board was drawn out from said plating bath, and washed by water. Then, the board was immersed in a hydrochloric acid solution of 2.4N at 30° C. for 3 minutes. After washing by water, the board was then immersed in an aqueous solution containing 300 ppm of palladium organic complex compound at 30° C. for 6 minutes. The board was drawn out. Then, the board was immersed in an aqueous solution containing sodium hydroxide and borohydride compound, each of concentrations 0.2 mol/l, at 30° C. for 4 minutes. After washing by water, the board was in said non-electrolytic copper plating bath. By repeating this procedure, a non-electrolytic copper plating film of thickness 35 μm–40 μm was formed on the board. The plating film was then stripped off from the stainless steel board. Tensile strength, elongation percentage and number of bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 4 and bath temperature 50° C., a plating film of thickness 35 μm–40 μm was formed on the board by the same plating process as described. The resultant board obtained by said process was then subjected to solder-dipping test. The number of cycles at which there occurred a crack in corner part of the holes was measured. The result is shown in Table 3.

EXAMPLE 14

By the same method as in Example 1, a catalyst was applied to a stainless steel board of which the surface was polished mechanically. This board was used as a board for plating.

The board was immersed in a non-electrolytic copper plating bath of composition 1 at bath temperature 70° C. and so a plating film of thickness 3 μm was formed on the board. The board was then drawn out from said plating bath, and washed by water. Then, the board was immersed in a mixed solution of hydrochloric acid and sulfuric acid, each of concentrations 2.0N, at 30° C. for 1 minute. After washing by water, the board was then immersed in an aqueous solution containing 200 ppm of palladium organic complex compound at 40° C. for 8 minutes. The board was drawn out from the solution. Then, the board was immersed in an aqueous solution containing sodium hydroxide and borohydride compound, each of concentrations 0.4 mol/l, at 30° C. for 4 minutes. After washing by water, the board was immersed in said non-electrolytic copper plating bath. By repeating this procedure, a non-electrolytic copper plating film of thickness 35 μm–40 μm was formed on the board. The plating film was then stripped off from the stainless steel board. Tensile strength, elongation percentage and number of bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 1 and bath temperature 70° C., a plating film of thickness 35 μm–40 μm was formed on the board by the same plating process as described. The resultant board obtained by said process was then subjected to solder-dipping test. The number of cycles at which there occurred a crack in corner part of the holes was measured. The result is shown in Table 3.

EXAMPLE 15

By the same method as in Example 1, a catalyst was applied to a stainless steel board of which the surface was polished mechanically. This board was used as a board for plating.

The board was immersed in a non-electrolytic copper plating bath of composition 3 at bath temperature 60° C. and so a plating film of thickness 2 μm was formed on the board. The board was then drawn out from said plating bath, and washed by water. Then, the board was immersed in a $PdCl_2$-$SnCl_2$-$NaCl$ solution of concentration 250 ppm at 50° C. for 4 minutes. After washing by water, the board was then immersed in a mixed solution containing 0.4 mol/l of sulfuric acid and 0.8 mol/l of oxalic acid at 30° C. for 7 minutes. After washing by water, the board was immersed in said non-electrolytic copper plating bath. By repeating this procedure, a non-electrolytic copper plating film of thickness 35 μm–40 μm was formed on the board. The plating film was then stripped off from the stainless steel board. Tensile strength, elongation percentage and number of bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic bath of composition 3 and bath temperature 60° C., a plating film of thickness 35 μm–40 μm was formed on the board by the same plating process as described. The resultant board obtained by the process was then subjected to solder-dipping test. The number of cycles at which there occurred a crack in corner part of the holes was measured. The result is shown in Table 3.

EXAMPLE 16

By the same method as in Example 1, a catalyst was applied to a stainless steel board of which the surface was polished mechanically. This was used as a board for plating.

The board was immersed in a non-electrolytic copper plating bath of composition 1 at bath temperature 60° C. and so a plating film of thickness 3 μm was formed on the board. The board was then drawn out from said plating bath, and washed by water. Then, the board was immersed in a PdCl$_2$-SnCl$_2$-NaCl solution of concentration 200 ppm at 45° C. for 6 minutes. After washing by water, the board was then immersed in a mixed solution containing 0.4 mol/l of sulfuric acid and 0.8 mol/l of oxalic acid at 30° C. for 7 minutes. After washing by water, the board was again immersed in said PdCl$_2$-SnCl$_2$-NaCl solution for 6 minutes. Then, after washing by water, the board was immersed in said reducing solution. After washing by water, said board was immersed in said non-electrolytic copper plating bath. By repeating this procedure, a non-electrolytic copper plating film of thickness 35 μm–40 μm was formed on the board. The plating film was then stripped off from the stainless steel board. Tensile strength, elongation percentage and number of bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 1 and bath temperature 60° C., a plating film of thickness 35 μm–40 μm was formed on the board by the same plating process as described. The resultant board obtained by said process was then subjected to solder-dipping test. The number of cycles at which there occurred a crack in corner part of the holes was measured. The result is shown in Table 3.

EXAMPLE 17

By the same method as in Example 1, a catalyst was applied to a stainless steel board of which the surface was polished mechanically. This was used as a board for plating.

The board was immersed in a non-electrolytic copper plating bath of composition 7 at bath temperature 60° C. and so a plating film of thickness 2 μm was formed on the board. The board was then drawn out from said plating bath, and washed by water. Then, the board was immersed in a non-electrolytic copper plating bath of composition 8 at bath temperature 60° C. and so a plating film of thickness 0.5 μm was formed on the board. The board was drawn out from the plating bath, and washed by water. Then, the board was immersed in said non-electrolytic copper plating bath of composition 7 and bath temperature 60° C. By repeating this procedure, a non-electrolytic copper plating film of thickness 35 μm–40 μm was formed on the board. The plating film was stripped off from the stainless steel board. Tensile strength, elongation percentage and number of bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 7 and bath temperature 60° C. and a non-electrolytic copper plating bath of composition 8 shown in Table 1 and bath temperature 60° C., a plating film of thickness 35 μm–40 μm was formed on the board by the same plating process as described. The resultant board obtained by said process was then subjected solder-dipping test. The number of cycles at which there occurred a crack in corner part of the holes was measured. The result is shown in Table 3.

EXAMPLE 18

By the same method as in Example 1, a catalyst was applied to a stainless steel board of which the surface was polished mechanically. This was used as a board for plating.

The board was immersed in a non-electrolytic copper plating bath of composition 7 at bath temperature 60° C. and so a plating film of thickness 2 μm was formed on the board. The board was then drawn out from said plating bath, and washed by water. Then, the board was immersed in a non-electrolytic copper plating bath of composition 7 at bath temperature 50° C. and so a plating film of thickness 0.7 μm was formed on the board. The board was drawn out from the plating bath, and washed by water. Then, the board was immersed in said non-electrolytic copper plating bath of composition 7 and bath temperature 60° C. By repeating this procedure, a non-electrolytic copper plating film of thickness 35 μm–40 μm was formed on the board. The plating film was then stripped off from the stainless steel board. Tensile strength, elongation percentage and number of bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 7 and bath temperature 60° C. and a non-electrolytic copper plating bath of composition 7 and bath temperature 50° C., a plating film of thickness 35 μm–40 μm was formed on the board by the same plating process as described. The resultant board obtained by said process was then subjected to solder-dipping test. The number of cycles at which there occurred a crack in corner part of the holes was measured. The result is shown in Table 3.

EXAMPLE 19

By the same method as in Example 1, a catalyst was applied to a stainless steel board of which the surface was polished mechanically. This was used as a board for plating.

The board was immersed in a non-electrolytic copper plating bath of composition 7 at bath temperature 60° C. and so a plating film of thickness 3 μm was formed on the board. The board was then drawn out from said plating bath, and washed by water. Then, the board was immersed in a non-electrolytic copper plating bath of composition 9 at bath temperature 70° C. and so a plating film of thickness 0.5 μm was formed on the board. The board was drawn out from said plating bath, and washed by water. Then, the board was immersed in said non-electrolytic copper plating bath of composition 7 and bath temperature 60° C. By repeating this procedure, a non-electrolytic copper plating film of thickness 35 μm–40 μm was fromed on the board. The plating film was then stripped off from the stainless steel board. Tensile strength, elongation percentage and number of bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 7 and bath temperature 60° C. and a non-electrolytic copper plating bath of composition 9 shown in Table 1 and bath temperature 70° C., a plating film of thickness 35 μm–40 μm was formed on the board by the same plating process as described. The resultant board obtained by said process was then subjected to solder-dipping test. The number of cycles at which there occurred a crack in corner part of the holes was measured. The result is shown in Table 3.

EXAMPLE 20

By the same method as in Example 1, a catalyst was applied to a stainless steel board of which the surface was polished mechanically. This board was used as a board for plating.

Said board was immersed in a non-electrolytic copper plating bath of composition 7 at bath temperature 60° C. and so a plating film of thickness 4 μm was formed on the board. The board was then drawn out from said plating bath, and washed by water. Then, the board was immersed in a non-electrolytic copper plating bath of composition 8 at bath temperature 70°0 C. and so a plating film of thickness 0.8 μm was formed on the board. The board was drawn out from said plating bath and washed by water. Then, the board was immersed in said non-electrolytic copper plating bath of composition 7 and bath temperature 60° C. By repeating this procedure, a non-electrolytic copper plating film of thickness 35 μm–40 μm was formed on the board. The plating film was then stripped off from the stainless steel board. Tensile strength, elongation percentage and bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 7 and bath temperature 60° C. and a non-electrolytic copper plating bath of composition 8 and bath temperature 70° C., a plating film of thickness 35 μm–40 μm was formed on the board by the same plating process as described. The resultant board obtained by said process was then subjected to solder-dipping test. The number of cycles at which there occurred a crack in corner part of the holes was measured. The result is shown in Table 3.

EXAMPLE 21

By the same method in Example 1, a catalyst was applied to a stainless steel board of which the surface was polished mechanically. This was used as a board for plating.

The board was immersed in a non-electrolytic copper plating bath of composition 7 at bath temperature 60° C. and so a plating film of thickness 3 μm was formed on the board. The board was then drawn out from said plating bath, and washed by water. Then, the board was immersed in a non-electrolytic copper plating bath of composition 9 at bath temperature 60° C. and so a plating film of thickness 0.6 μm was formed on the board. The board was drawn out from said plating bath, and washed by water. Then, the board was immersed in said non-electrolytic copper plating bath of composition 7 and bath temperature 60° C. By repeating this procedure, a non-electrolytic copper plating film of tickness 35 μm–40 μm was formed on the board. The plating film was then stripped off from the stainless steel board. Tensile strength, elongation percentage and number of bending times of the plating film were measured by the same methods as in Example 1. The result are shown in Table 2.

In a copper-clad glass fabric base epoxy resin board holes were made in the same manner as in Example 1. A catalyst was then applied to the board by the same method as in Example 1. By using a non-electrolytic copper plating bath of composition 7 and bath temperature 60° C. and a non-electrolytic copper plating bath of composition 9 and bath temperature 60° C., a plating film of thickness 35 μm–40 μm was formed on the board by the same plating process as described. The resultant board obtained by said process was then subjected to solder-dipping test. The number of cycles at which there occurred a crack in corner part of the holes was measured. The result is shown in Table 3.

EXAMPLE 22

By the same method as in Example 1, a catalyst was applied to a stainless steel board of which the surface was polished mechanically. This board was used as a board for plating.

The board was immersed in a non-electrolytic copper plating bath of composition 8 at bath temperature 60° C. and so a plating film of thickness 2 μm was formed on the board. The board was then drawn out from said plating bath, and washed by water. Then, the board was immersed in a non-electrolytic copper plating bath of composition 7 at bath temperature 60° C. and so a plating film of thickness 0.5 μm was formed on the board. The board was drawn out from said plating bath, and washed by water. Then, the board was immersed in said non-electrolytic copper plating bath of composition 8 and bath temperature 60° C. By repeating this procedure, a plating film of thickness 35 μm–40 μm was formed on the board. The plating film was then stripped off from the stainless steel board. Tensile strength, elongation percentage and number of bending times of the plating film was measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 8 and bath temperature 60° C. and a non-electrolytic copper plating bath of composition 7 and bath temperature 60° C., a plating film of thickness 35 μm–40 μm was formed on the board by the same plating process as described. The resultant board obtained by said process was then subjected to solder-dipping test. The number of cycles at which there occurred a crack in corner part of the holes was measured. The result is shown in Table 3.

EXAMPLE 23

By the same method as in Example 1, a catalyst was applied to a stainless steel board of which the surface was polished mechanically. This board was used as a board for plating.

The board was immersed in a non-electrolytic copper plating bath of composition 9 at bath temperature 70° C. and so a plating film of thickness 5 μm was formed on the board. The board was then drawn out from said plating bath, and washed by water. Then, the board was immersed in a sulfuric acid solution of 3.6N at 30° C. for 2 minutes. After washing by water, the board was immersed in a non-electrolytic copper plating bath of composition 8 at bath temperature 60° C. and so a plating film of thickness 0.4 μm was formed on the board. The board was drawn out from said plating bath. The activation treatment was then applied to the board. Then, the board was immersed in said non-electrolytic copper plating bath of composition 9 and bath temperature 70° C. By repeating this procedure, a plating film of thickness 35 μm–40 μm was formed on the board. The plating film was then stripped off from the stainless steel board. Tensile strength, elongation percentage and number of bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 9 and bath temperature 70° C. and a non-electrolytic copper plating bath of composition 8 and bath temperature 60° C., a plating film of thickness 35 μm–40 μm was formed on the board by the same plating process as described. The resultant board obtained by said process was then subjected to solder-dipping test. The number of cycles at which there occurred a crack in corner part of the holes was measured. The result is shown in Table 3.

EXAMPLE 24

By the same method as in Example 1, a catalyst was applied to a stainless steel board of which the surface was polished mechanically. This board was used as a board for plating.

The board was immersed in a non-electrolytic copper plating bath of composition 7 at bath temperature 50° C. and so a plating film of thickness 2 μm was formed on the board. The board was then drawn out from said plating bath, and washed by water. Then, the board was immersed in a hydrochloric acid solution of 1.2 N at 40° C. for 3 minutes. After washing by water, the board was immersed in an aqueous $PdCl_2$-$SnCl_2$-NaCl solution of concentration 250 ppm at 50° C. for 6 minutes. After washing the board by water, the board was then immersed in an aqueous solution containing sulfuric acid and oxalic acid, each of concentration 0.4 mol/l, for 7 minutes. Then, after washing the board by water, the board was immersed in a non-electrolytic copper plating bath of composition 9 at bath temperature 70° C. and so a plating film of thickness 0.5 μm was formed on the board. The board was drawn out from the plating bath. Said activation treatment was then applied to the board. Then, the board was immersed in said non-electrolytic copper plating bath of composition 7 and bath temperature 50° C. By repeating this procedure, a non-electrolytic copper plating film of thickness 35 μm–40 μm ws formed on the board. The plating film was then stripped off from the stainless steel board. Tensile strength, elongation percentage and number of bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 7 and bath temeprature 50° C. and a non-electrolytic copper plating bath of composition 9 and bath temperature 70° C., a plating film of thickness 35 μm–40 μm was formed on the board by the same plating process as described. The resultant board obtained by said process was then subjected to solder-dipping test. The number of cycles at which there occurred a crack in corner part of the holes was measured. The result is shown in Table 3.

EXAMPLE 25

By the same method as in Example 1, a catalyst was applied to a stainless steel board of which the surface was polished mechanically. This board was used as a board for plating.

The board was immersed in a non-electrolytic copper plating bath of composition 7 at bath temperature 60° C. and so a plating film of thickness 3 μm was formed on the board. The board was then drawn out from said plating bath, and washed by water. Then, the board was immersed in a $PdCl_2$-$SnCl_2$-NaCl solution of concentration 250 ppm at 45° C. for 5 minutes. After washing the board by water, the board was immersed in an aqueous solution containing sulfuric acid and oxalic acid, each of concentrations 0.4 mol/l, at 40° C. for 6 minutes. Then, after washing the board by water, the board was immersed in a non-electrolytic copper plating bath of composition 8 at bath temperature 70° C. and so a plating film of thickness 0.6 μm was formed on the board. The board was drawn out from said plating bath. The activation treatment was then applied to the board. Then, the board was immersing in said non-electrolytic copper plating bath of composition 7 and bath temperature 60° C. By repeating this procedure, a non-electrolytic copper plating film of thickness 35 μm–40 μm was formed on the board. The plating film was then stripped off from the stainless steel board. Tensile strength, elongation percentage and number of bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 7 and bath temperature 60° C. and a non-electrolytic copper plating bath of composition 8 and bath temperature 70° C., a plating film of thickness 35 μm–40 μm was formed on the board by the same plating process as described. The resultant board obtained by said process was then subjected to solder-dipping test. The number of cycles at which there occurred a crack in corner part of the holes was measured. The result is shown in Table 3.

EXAMPLE 26

By the same method as in Example 1, a catalyst was applied to a stainless steel board of which the surface was polished mechanically. This was used as a board for plating. The board was immersed in a non-electrolytic copper plating bath of composition 9 at bath temperature 70° C. and so a plating film of thickness 4 μm was formed on the board. The board was then drawn out from said plating bath, and washed by water. Then, the board was immersed in a sulfuric acid solution of 3.6N at 30° C. for 3 minutes. After washing the board by water, the board was immersed in a non-electrolytic copper plating bath of composition 9 at bath temperature 60° C. and so a plating film of thickness 0.7 μm was formed on the board. The board was drawn out from said plating bath, and washed by water. Then, the board was immersed in said non-electrolytic copper plating bath of composition 9 and bath temperature 70° C. By repeating this procedure, a non-electrolytic copper plating film of 35 μm–40 μm was formed on the board. The plating film was then stripped off from the stainless steel board. Tensile strength, elongation percentage and number of bending times of the plating film were measured by the same methods as in Example 1. The result are shown in Table 2.

In a copper-clad glass fabric base epoxy resin board holes were made in the same manner as in Example 1. A catalyst was then applied to the board by the same method as in Example 1. By using a non-electrolytic copper plating bath of composition 9 and bath temperature 70° C. and a non-electrolytic copper plating bath of composition 9 and bath temperature 60° C., a plating film of thickness 35 μm–40 μm was formed on the board by the same plating process as described. The resultant board obtained by said process was then subjected to solder-dipping test. The number of cycles at which there occurred a crack in corner part of the holes was measured. The result is shown in Table 3.

EXAMPLE 27

By the same method as in Example 1, a catalyst was applied to a stainless steel board of which the surface was polished mechanically. This board was used as a board for plating.

The board was immersed in a non-electrolytic copper plating bath of composition 8 at bath temperature 70° C. and so a plating film of thickness 2 μm was formed on the board. The board was then drawn out from said plating bath, and washed by water. Then, the board was immersed in a non-electrolytic copper plating bath of composition 9 at bath temperature 60° C. and so a plating film of thickness 0.5 μm was formed on the board. The board was drawn out from the plating bath, and washed by water. The board was then immersed in an aqueous $PdCl_2$-$SnCl_2$-$NaCl$ solution of concentration 250 ppm at 50° C. for 5 minutes. After washing the board by water, the board was immersed in an aqueous solution containing sulfuric acid and oxalic acid, each of concentrations 0.3 mol/l, at 30° C. for 8 minutes. Then, after washing the board by water, the board was immersed in said non-electrolytic copper plating bath of composition 8 and bath temperature 70° C. By repeating this procedure, a non-electrolytic copper plating film of thickness 35 μm–40 μm was formed on the board. The plating film was then stripped off from the stainless steel board. Tensile strength, elongation percentage and number of bending times of the plating film were measured by the same methods as in Example 1. The results are shown in Table 2.

In a copper-clad glass fabric base epoxy resin board holes were made in the same manner as in Example 1. A catalyst was then applied to the board by the same method as in Example 1. By using a non-electrolytic copper plating bath of composition 8 and bath temperature 70° C. and a non-electrolytic copper plating bath of composition 9 and bath temperature 60° C., a plating film of thickness 35 μm–40 μm was formed on the board by the same plating process as described. The resulting board obtained by said process was then subjected to solder-dipping test. The number of cycles at which there occurred a crack in corner part of the holes was measured. The result is shown in Table 3.

As is apparent from Table 2 and Table 3 in the above, non-electrolytic copper plating film obtained according to the present invention possesses a tensile strength of from 36 $Kg/mm^2$ to 48 $Kg/mm^2$, an elongation percentage of from 3.4% to 5.6% and a number of bending times of from three to four in mechanical characteristics. By comparison with those of copper electroplating film, it is thus evident that the above values are almost the same as tensile strength 30 $Kg/mm^2$–50 $kg/mm^2$, elongation percentage 3%–8% and number of bending times four of the copper electroplating film. Accordingly, by the process of the present invention, non-electrolytic copper plating film having mechanical characteristics similar to those of copper electroplating film can be obtained.

SUMMARY OF THE INVENTION

A process of non-electrolytic copper plating for a printed circuit board for obtaining non-electrolytic copper plating film havig mechanical characteristics similar to those of copper electroplating film wherein in non-electrolytic copper plating in the manufacture of printed circuit boards, to obtain a desired thickness of plating film using one or two kinds of non-electrolytic copper plating baths the deposition of non-electrolytic copper plating onto a board for plating is suspended at least one time by withdrawal thereof from said plating bath and so the non-electrolytic copper plating film is formed in plural plating layers.

What is claimed is:

1. A process of non-electrolytic copper plating of a printed circuit board with through-holes obtaining a non-electrolytic copper plating film on said board, having mechanical characteristics similar to those of copper electroplating film, said process comprising at least one sequence of the following steps (a)–(f) before desired thickness of copper film deposits on said board:
   (a) immersing said printed circuit board to be plated in a single non-electrolytic copper plating bath,
   (b) drawing out said printed circuit board from the plating bath,
   (c) immersing said printed circuit board in a 1.0–10N of inorganic acid aqueous solution of 20°–40° C. for 1–10 minutes,
   (d) drawing out said printed circuit board from the acid aqueous solution,
   (e) washing said printed circuit board with water, and
   (f) immediately after the washing, immersing said printed circuit board again in the non-electrolytic copper plating bath.

2. The process according to claim 1, wherein the temperature range of the inorganic acid aqueous solution is 30°–40° C.

3. The process according to claim 1, wherein the concentration range of the inorganic acid solution is 2.0–10.0N.

4. The process according to claim 1, wherein the immersing time of the printed circuit board in the inorganic acid aqueous solution is 5–10 minutes.

5. The process according to claim 1, wherein the inorganic acid is hydrochloric acid.

6. The process according to claim 1, wherein the ratio of thickness of a copper plating layer deposited on the board at each immersion to final thickness of total copper plating layer deposited on the board ranges from 1/100 to ½.

7. The process according to claim 1, wherein the ratio of thickness of a copper plating layer deposited on the board at each immersion to final thickness of total copper plating layer deposited on the board ranges from 1/50 to ¼.

* * * * *